United States Patent [19]

Marris

[11] Patent Number: 5,610,926
[45] Date of Patent: Mar. 11, 1997

[54] METHOD & CIRCUIT FOR TESTING IC LOGIC CIRCUITS

[75] Inventor: Arthur Marris, Gunnersbury Park, Great Britain

[73] Assignee: Texas Instruments Incorporated, Dallas, Tex.

[21] Appl. No.: 534,086

[22] Filed: Sep. 26, 1995

Related U.S. Application Data

[63] Continuation of Ser. No. 201,608, Feb. 25, 1994, abandoned.

[30]     Foreign Application Priority Data

Feb. 25, 1993 [GB] United Kingdom .................. 9303758

[51] Int. Cl.⁶ ................................................. G01R 31/28
[52] U.S. Cl. ........................................ 371/22.3; 371/22.5
[58] Field of Search .............................. 371/22.3, 22.5, 371/22.6, 22.1; 324/158 R

[56]      References Cited

U.S. PATENT DOCUMENTS 5,043,986  8/1991  Agrawal et al. .................. 371/25.1
5,132,974  7/1992  Rosales ............................. 371/22.3
5,225,834  7/1993  Imai et al. ......................... 341/120
5,260,947  11/1993  Posse ............................... 371/22.3
5,329,533  7/1994  Lin .................................... 371/22.3

*Primary Examiner*—Emanuel T. Voeltz
*Assistant Examiner*—Patrick J. Assouad
*Attorney, Agent, or Firm*—William B. Kempler; Richard L. Donaldson

[57]       ABSTRACT

Integrated logic circuit and method of functionally testing the integrated logic circuit, wherein the integrated logic circuit includes storage elements configurable as at least a part of a scan path in which a feedback from elements in the path to a previous element is provided. The method of functionally testing the integrated logic circuit effectively provides a simple exercising of the integrated logic circuit by clocking the elements in the scan path. In a specific aspect, the feedback arrangement provides a linear feedback shift register with exclusive-OR gating.

6 Claims, 6 Drawing Sheets

| | | |
|---|---|---|
| GND | ——— | GND |
| MADL5 | ←∧∧→ | PS2 |
| VCC | ——— | PS1 |
| MADL6 | ←∧∧→ | PS2 |
| MADL7 | ←∧∧→ | PS2 |
| MAXPL | ←∧∧→ | PS2 |
| MAXPH | ←∧∧→ | PS2 |
| MADH0 | ←∧∧→ | PS2 |
| MADH1 | ←∧∧→ | PS2 |
| MADH2 | ←∧∧→ | PS2 |
| GND | ——— | GND |
| GND | ——— | GND |
| MADH3 | ←∧∧→ | PS2 |
| GND | ——— | GND |
| MADH4 | ←∧∧→ | PS2 |
| VCC | ——— | PS1 |
| VCC | ——— | PS1 |
| MADH5 | ←∧∧→ | PS2 |
| MADH6 | ←∧∧→ | PS2 |
| MADH7 | ←∧∧→ | PS2 |
| MBEN | ←∧∧→ | PS2 |
| MOE | ←∧∧→ | PS2 |
| MRAS | ←∧∧→ | PS2 |
| MW | ←∧∧→ | PS2 |
| GND | ——— | GND |
| MCAS | ←∧∧→ | PS2 |
| GND | ——— | GND |
| MAX2 | ←∧∧→ | PS2 |
| VCC | ——— | PS1 |
| MAX0 | ←∧∧→ | PS2 |
| MDDIR | ←∧∧→ | PS2 |
| MAL | ←∧∧→ | PS2 |
| SBRLS | ←∧∧→ | PS2 |
| | ——— | MONITOR ——o |
| MBRQ | ←∧∧→ | PS2 |
| EXTINT | ←∧∧→ | PS2 |
| VCC | ——— | PS1 |
| MBGR | ←∧∧→ | PS1 |
| MANT1 | ←∧∧→ | PS1 |
| MANT0 | ←∧∧→ | GND |
| GND | ——— | GND |
| MRESET | ←∧∧→ | A0 |
| MBCLK2 | | |
| MBCLK1 | ←∧∧— | |
| GND | ——— | GND |
| PLLCAP | | |
| VCC | ——— | PS1 |
| MADL0 | ——— | GND |
| MADL1 | ←∧∧→ | PS2 |
| MADL2 | ←∧∧→ | PS2 |
| MADL3 | ←∧∧→ | PS2 |
| GND | ——— | GND |
| MADL4 | ←∧∧→ | PS2 |

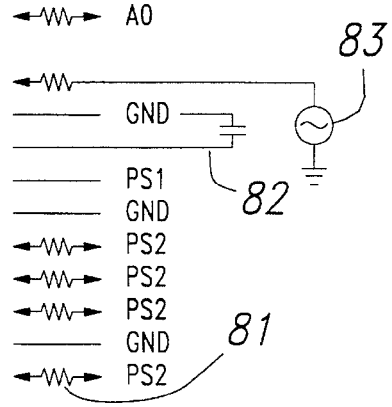

*Fig. 8*

METHOD & CIRCUIT FOR TESTING IC LOGIC CIRCUITS

This application is a continuation, of application Ser. No. 08/201,608, filed Feb. 25, 1994, now abandoned on Oct. 1, 1996.

The present invention relates to integrated logic circuits and in particular a method of exercising such circuits without recourse to complex external test pattern generation and more particularly provides an integrated circuit that may be exercised to a substantial extent, based on a relatively simple input regime.

Very large scale integration techniques allow a large amount of logic to be realized by a single device. Such a device can be difficult to test, however, due to its complexity in relation to the limited access to circuit nodes provided by external device pins. Nonetheless it is normally possible to provide a functional test by driving device inputs with known test patterns and monitoring outputs for a consistent response. In the case of combinatorial logic, a series of test patterns may be defined which fully exercises all possible device states to provide an exhaustive test which can form the basis of a practical test if the number of inputs is not excessive. For devices having storage elements the task can be significantly more complex, but by clocking elements to known states as part of testing, worthwhile test patterns are still possible. Unfortunately, the derivation of a substantially exhaustive test pattern can become a design exercise rivaling that of the device itself in complexity and represents a significant cost to which the cost of equipment required in practice to generate the test vectors and that of testing time must be added. Such costs can be prohibitive for low production quantities and a limitation in, for example, the application specific device market.

In an attempt to overcome this problem 'Design for Test' philosophies have been developed and are aimed at making devices more testable without recourse to full test vector generation. For example, one such philosophy is based upon arranging that all storage elements within a device are configurable, in a special test mode of device operation into one or more chains and able to receive clock signals so that the chain behaves as a shift register. The device, whatever its intended function, may then be regarded as relatively simple (i.e. easily tested) combinatorial blocks between shift register stages providing inputs and outputs to the blocks. By providing an input pin at one end of the chain so that register stages may be loaded and an output pin at the other so that stages may be interrogated, testing independent of knowledge of overall intended device functionality is possible. Of course, external equipment to generate the test vectors to be loaded and examine the resultant output is still required, but at least the test vector derivation task has been simplified. Reference may be made to IEEE Standard 1149.1-1990 which was developed under the auspices of the Joint Test Action Group (JTAG). The approach itself has become known as "JTAG".

The Design for Test philosophy may be useful even where devices cannot be internally configured to provide scan paths. According to one aspect of JTAG, for example, devices are provided with scannable storage elements at least at key input and output pins. When several such devices are connected, the overall circuit may be tested in accordance with scan techniques. A similar technique (boundary scan) can be employed to verify device interconnection and an arrangement for testing a circuit assembled on a printed circuit board is described in UK Patent Application 92 17728 filed on 20 Aug. 1992.

Apart from a one off functional test of a particular production device, there is the issue of reliability. To determine reliability, an accelerated life test might be performed on a batch of devices. Such a test might involve prolonged operation under high stress conditions (high temperature, maximum allowable input values, high frequency, etc) in an attempt to promote the onset of faults that would appear only much later in normal use. A similar approach can be taken in production to eliminate specimens that would fail prematurely in normal use.

A feature of accelerated life testing is that devices under test need to be exercised at the same time as they are exposed to the stressful environment. Typically, it is not cost effective or practicable to place functional testing equipment within the environmental chamber that establishes the test conditions so limited functionality test fixtures are used, arranged to exercise the devices as much as possible in the circumstances; a few test patterns stored in read only memory, together with some clock generation, for example. Unfortunately, the full test patterns discussed earlier although they fully exercise the device, will not typically be useful (too large, complex or non-existent) meaning that yet another design exercise has to be undertaken to produce the exercise pattern, adding further to design costs.

The present invention has been made in an attempt to ameliorate the accelerated life design overhead. According to the present invention in a first aspect thereof there is provided a method of exercising an integrated logic circuit, wherein storage elements are configurable as at least a part of a scan path including the steps of providing a feedback from elements in the path to a previous element, and clocking the elements in the path.

According to the present invention in a second aspect thereof there is provided an integrated logic circuit, wherein storage elements are configurable as at least part of a scan path including a feedback from elements in the path to a previous element.

According to the present invention in a third aspect thereof there is provided accelerated life testing apparatus arranged to perform the method claimed in claim 1.

In order that features and advantages of the present invention may be more fully appreciated, embodiments will now be described with reference to the accompanying diagrammatic drawing figures of which:

FIG. 8 shows an accelerated life test configuration.

Figure 1:
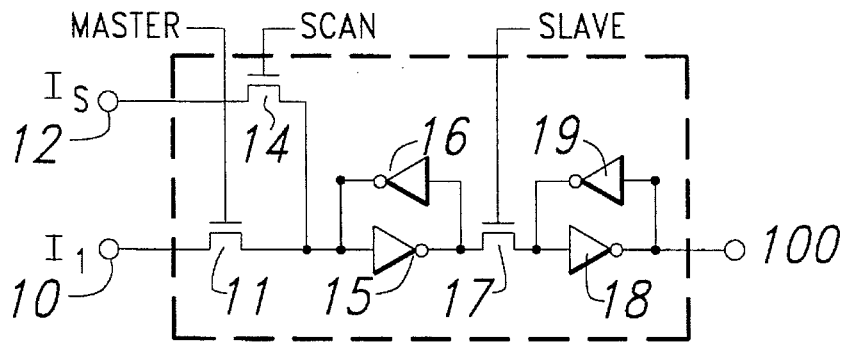
FIG. 1 represents a shift register latch.

In an integrated logic circuit to be designed in accordance with design for test principles, storage elements are provided by shift register latches. In a shift register latch (FIG. 1) a signal present at an input 10 may be clocked to a master latch formed of two inverters (15, 16) by application of a master clock pulse to a master clock transistor 11. The information is further clocked by applying a slave clock pulse to a slave clock transistor 17 to latch a slave formed by two inverters (18, 19) which provides a latched output at 100. It will be appreciated that the arrangement described thus far provides a master slave latch of conventional behavior. An alternative input 12 may be latched by using scan clock transistor 14 in conjunction with slave clock transistor 17, hence either main input $I_1$ or scan input $I_s$ will be latched depending upon whether the master or the scan clock is used.

The logical functionality of the desired circuit is designed by using main input $I_1$ in conjunction with output 100 in a plurality of shift register latches in combination with combinatorial logic gates. As part of Design for Test however, the shift register latches are additionally connected in series with each output 100 connecting to the auxiliary scan input $I_s$ of a different shift register latch. Thus, by entering a mode wherein the scan clock is used instead of the master clock, data may be transferred from one shift register latch to the next along what is referred to in the art as a scan path. By providing an overall scan input and an overall scan output, the contents of the shift register latches maybe loaded and interrogated.

Figure 2:
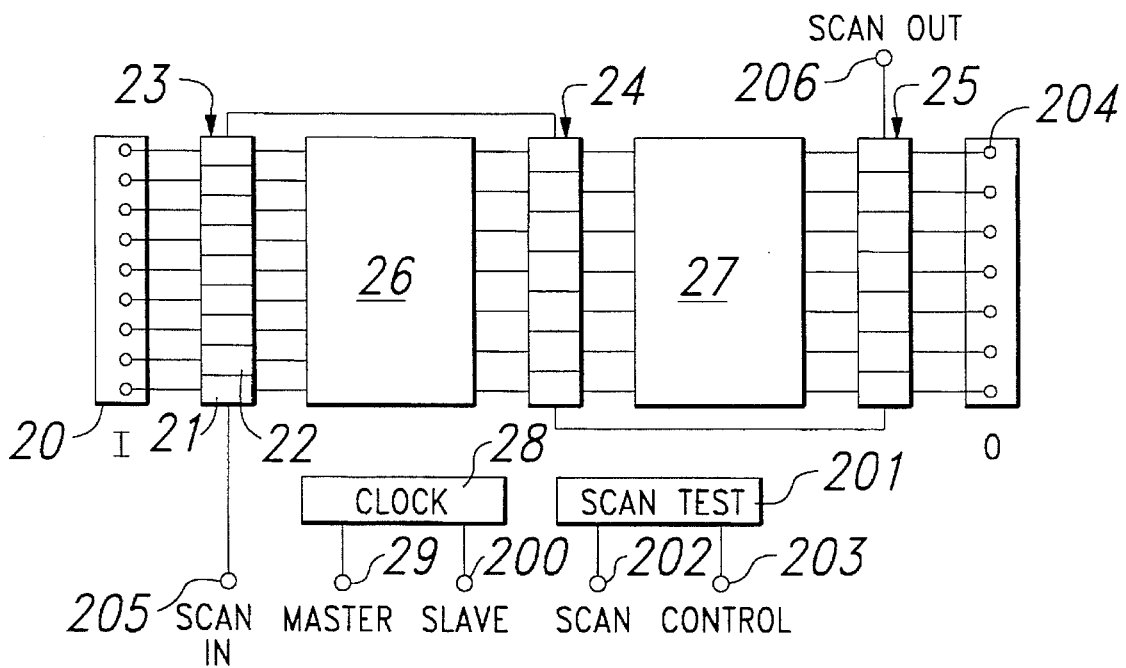
FIG. 2 represents a logic circuit for integration designed in accordance with "Design for Test" principles.

The arrangement is shown more clearly in FIG. 2, wherein a plurality of circuit inputs I (20) are shown connected in the first place to a bank of shift register latches 23 then onto a block of combinatorial logic 26 and then to a further bank of shift register latches 24. In this way, the functionality of the desired logic integrated circuit is provided. In the present case, a further block of combinatorial logic 27 and together with a yet further bank of shift register latches 25 provides the eventual outputs O (204). Master and slave clocks are, in use, provided to the circuit by inputs 29 and 200 respectively which are shown feeding a clock generator 28. Not shown are the internal clock conditioning and gating circuits which provide clock signals via internal interconnections to each and every set register latch as described with respect to FIG. 1. In alternative arrangements, all clock signals may be internally derived from a single externally applied clock.

The shift register latches are shown symbolically connected together one to the next such that output 100 of shift register latch 21 is connected to scan input 12 of shift register latch 22 and this connection is repeated for all shift register latches in the bank. The banks themselves are interconnected as shown such that there is an overall single scan input 205 and overall single scan output 206 for the entire device.

When the device is to operate normally, clock signals are fed to the master and the slave to control the operation of the circuit in response to inputs applied to the input pins 20 to generate the required outputs at the output pins 204 in accordance with the design specification. By applying suitable control signals via an input 203 to scan test control logic 201, an alternative mode of operation may be entered wherein a scan clock replaces the master clock. For example, when it is desired to test the circuit one might proceed as follows.

1. Load the shift register latches with predetermined test data by applying a serial data stream to the scan input 205, the scan clock to input 202 and the slave clock to input 200. At the end of this, known inputs will be applied to combinatorial logic blocks 26 and 27.
2. Load the outputs of the combinatorial logic to the shift register latches in banks 24 and 25 by enabling the master and slave clocks.
3. Clock the output data produced by the combinatorial logic out via the scan output 206 by enabling the scan and slave clocks. Compare the data with that expected from the test pattern originally input to evaluate functionality of the device.

It will be realized that although this procedure has simplified testing in that no overall sequence of test patterns sufficient to test the device fully needs to be designed or generated, there is still the need to specify test patterns adequate to exercise the combinatorial blocks which remains a significant task and, in testing an individual production device, there is the need to generate these test patterns and apply them to a device under test.

Consider now that a production device is to be subject to an accelerated life test. A device under test is placed in an environmental chamber capable of providing the high stress environment for the test to proceed. What is required now is that the individual device be subjected to the specified environment whilst it is being functionally exercised. To provide the excitation in accordance with the prior art, signal generation means is provided within the chamber and arranged to provide a predetermined sequence of signals to exercise the device.

Figure 3:
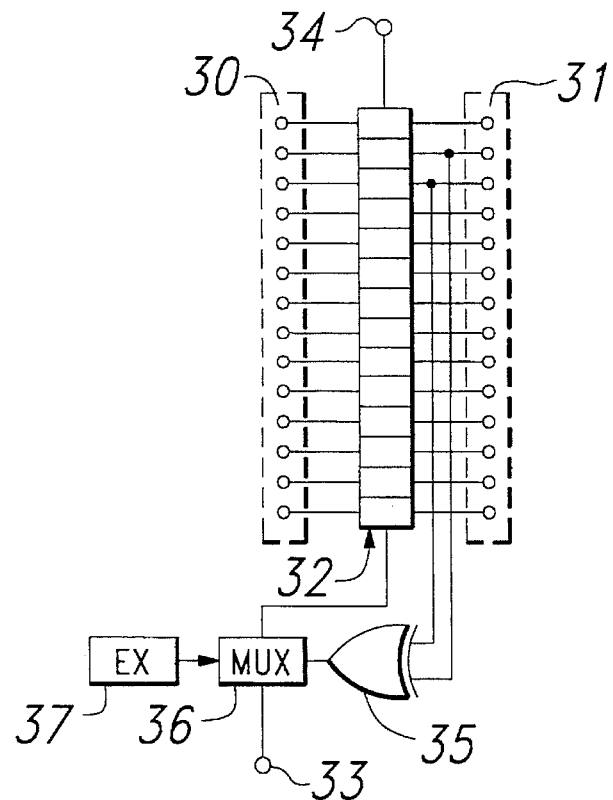
FIG. 3 represents a scannable chain of shift register latches incorporating the present invention.

By contrast, in accordance with the present invention two of the outputs 31 of a scannable chain of shift register latches 32 (FIG. 3) are connected to an exclusive-OR gate 35. A multiplexer 36 under the control of an exercise register 37 is provided so that the output of the exclusive-OR gate may be fed back directly to the scan input of the shift register latch chain 32. The effect of this connection is to provide a linear feedback shift register arrangement. As is known in the art (see for example Horowitz and Hill, "The Art of Electronics", Cambridge University Press, 1980 (p. 438–9)) a linear feedback shift register is capable of providing a pseudo random binary sequence. Hence it will be realized that, with the circuit configured as aforesaid, the shift register constituted by the scan path of shift register latches itself behaves as a pattern generator applying a plurality of changing inputs 31 to subsequent combinatorial logic. Exercise of the device can be achieved by feeding no more than simple input (power supply and scan and slave clock signals) to the device whilst undergoing an accelerated life test. By monitoring the overall scan output (for example, 206 of the device of FIG. 2) then a dynamic signal providing confirmation of operation may be monitored. The exercise of the device may be controlled via a control input 37 in a way analogous to entering the test mode.

Figure 4:
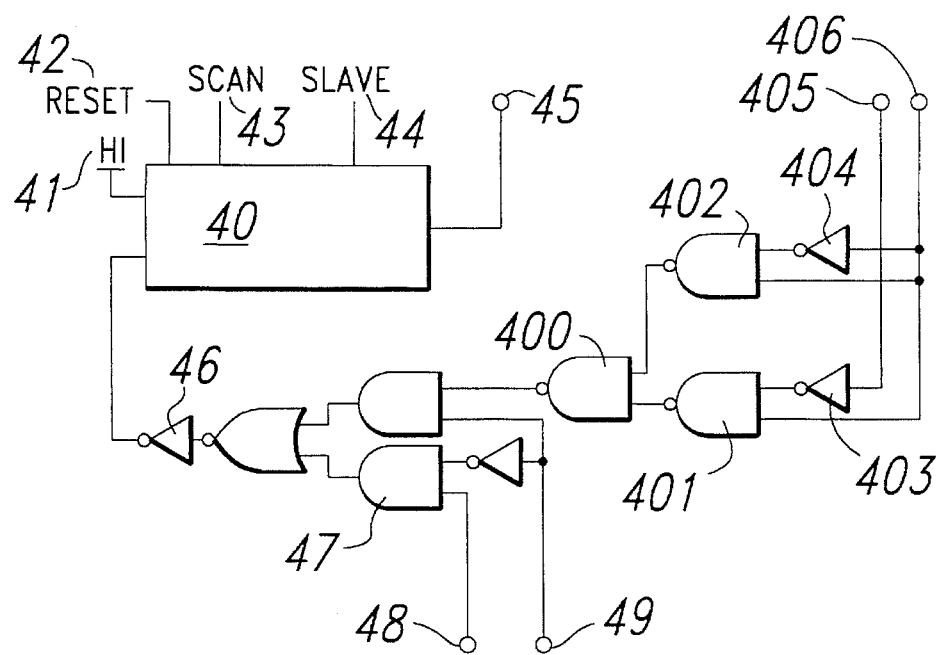
FIG. 4 shows part of an alternative embodiment.

A circuit implementation of an exclusive-OR gate is illustrated in FIG. 4, wherein shift register latch feedback signals 405 and 406 are connected to NAND gates 401 and 402 and inverters 403 and 404. The outputs of NAND gates 401 and 402 are further connected to a NAND gate 400 so as to realize the exclusive-OR function. A multiplexer is provided by a gate network 47 in conjunction with inverter 46 so that either the output of NAND gate 400 or the normal scan input connected to input 48 (cf. 33 of FIG. 3) may be fed to a shift register latch 40 dependent upon the state of control input 49. Shift register latch 40 is the first latch in the scan path of the device.

Since a linear feedback shift register will fail to generate a pseudo random binary sequence in the event that it has all zeros as an initial value, in designs where this is possible, it must be accommodated. To this end in the present embodiment the first shift register latch 40 (not constituting part of the functional arrangement of the circuit) is forced with an initial high value 41 when the circuit is re-set by using the re-set signal as the master clock on input 42. It will be appreciated that in some embodiments this stage will not be required. When scanning is to occur, the scan clock and slave clocks may be applied in the way described to inputs 43 and 44 to generate the first scan output in the chain (45).

It will be appreciated that the same technique may be applied to devices with multiple scan paths in the same device either by providing that the scan paths are configurable in series, or by arranging the shift register latch chain as a plurality of linear feedback shift registers.

The ability to self exercise has been provided to an integrated logic circuit with a very small overhead in device layout. In many embodiments only an exclusive-OR gate and a multiplexer are required to add this feature to the device, which is a very small device area.

The technique described above may be applied to any scan chain, including those formed between devices. In this case the exclusive-OR and multiplex functions may be provided as part of one of the interconnected devices or externally. An assembled circuit board having boundary scannable device may thus be subjected to a self exercised accelerated life test.

An alternative embodiment of an integrated logic device will now be considered.

Figure 5:
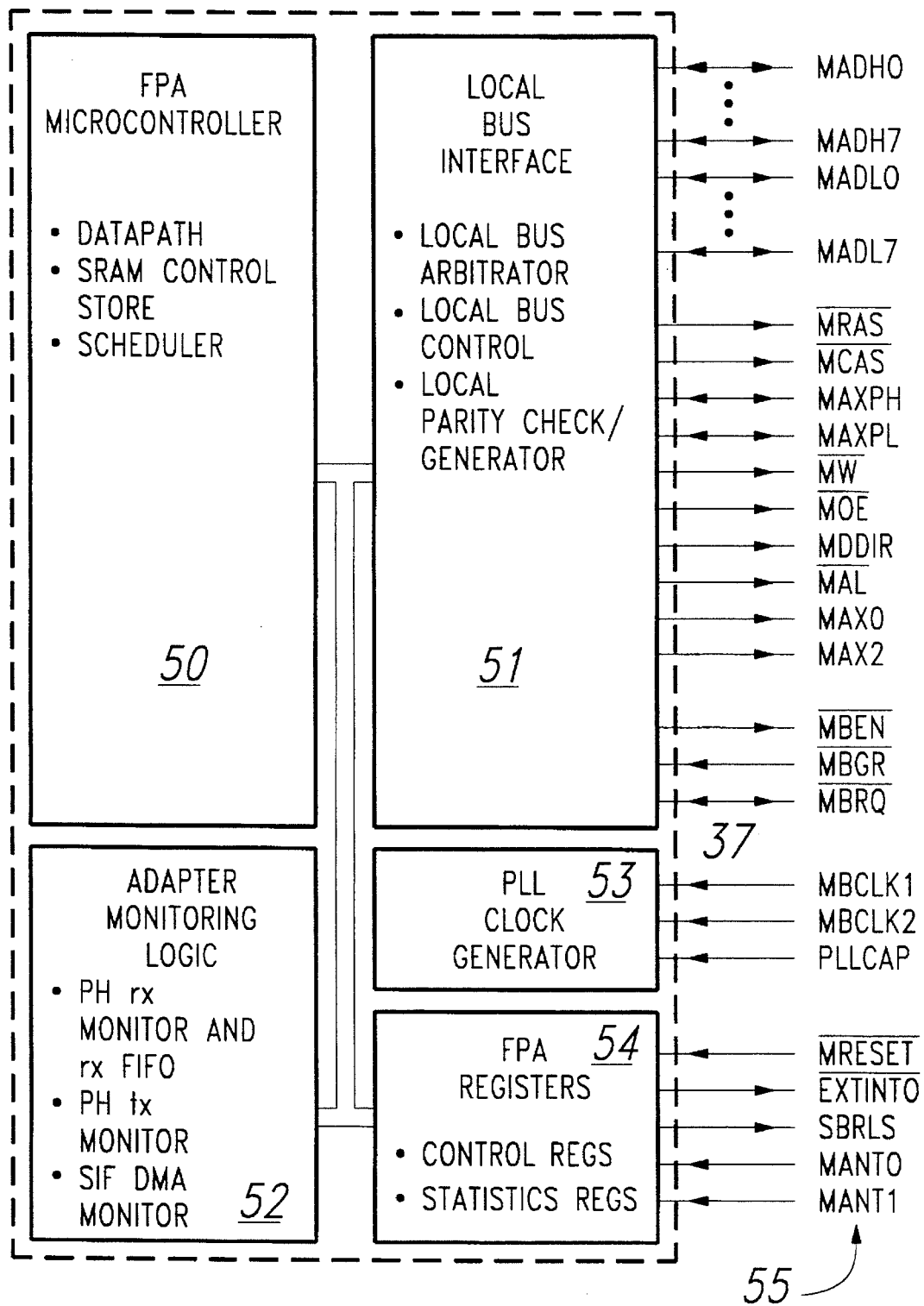
FIG. 5 represents a block diagram of a "Design for Test" device.

A block diagram of a logic device integrated onto a single substrate in shown in FIG. 5. The device is a frame processing accelerator for use in conjunction with a local area network adaptor. The precise functionality of the device does not form part of the present invention, however it will be observed that the device includes a microcontroller 50 (implementing datapath manipulation, control of static random access memory and scheduling), a local bus interface 51 (performing bus arbitration, control and parity checking), monitoring logic 52 (in particular packet header receive and transmit monitoring and system direct memory access monitoring), a phase locked loop clock generator 53 for deriving internal clocks from external inputs and some control registers 54. A plurality of inputs and outputs 55 are designated as shown. Some portions of the device relevant to understanding of the present invention will now be described in more detail.

Figure 6:
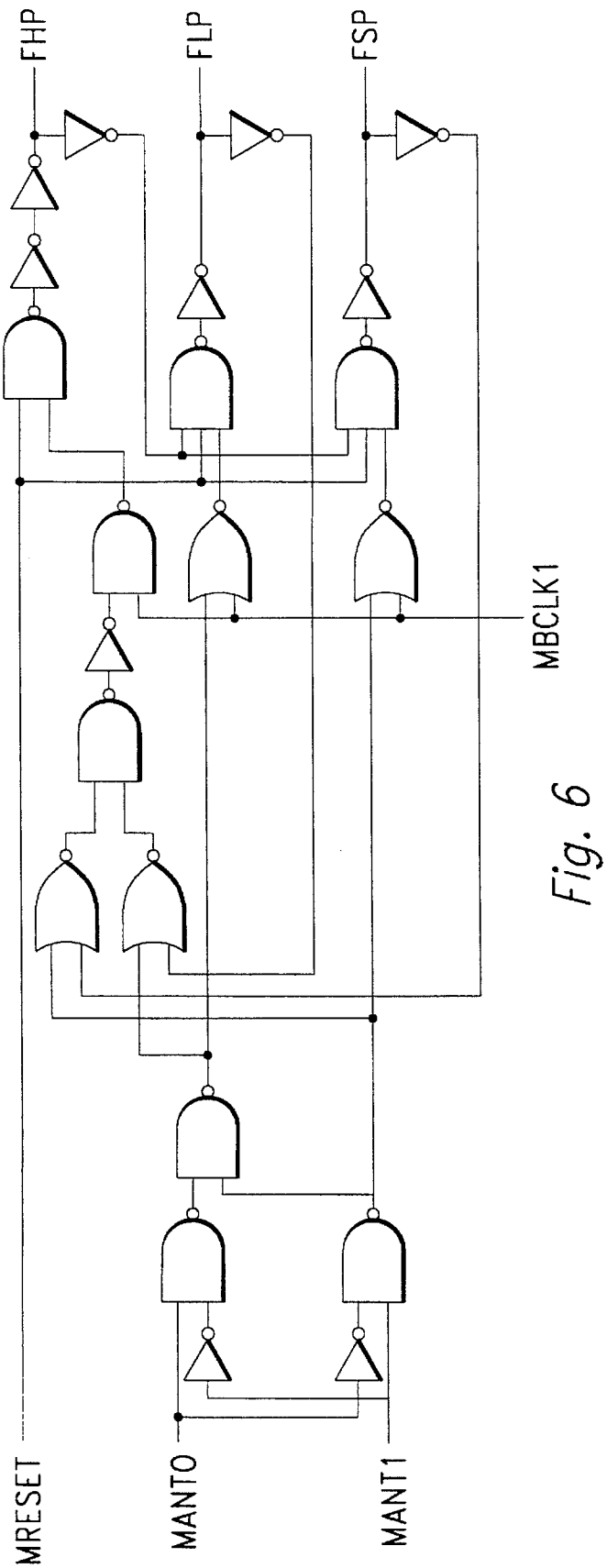
FIG. 6 and FIG. 7 are details of some logic present in the device of FIG. 5.

Gating logic 60 (FIG. 6) generates internal main clock FLP, slave clock FHP and scan clock FSP signals from a main clock input MBCLK1. The clock generators may be held at a particular level by applying a suitable signal to the reset input MRESET. Clock generation is controlled with respect to two control inputs MANT0, MANT1 which gate either the master clock FLP or the scan clock FSP to the shift register latches (not shown but hereinbefore described). It will be noted in particular that when MANT1 is high and MANT0 is low, the scan (FSP) and slave (FHP) clocks are operative. In other words, the device is in the scan test mode.

Figure 7:
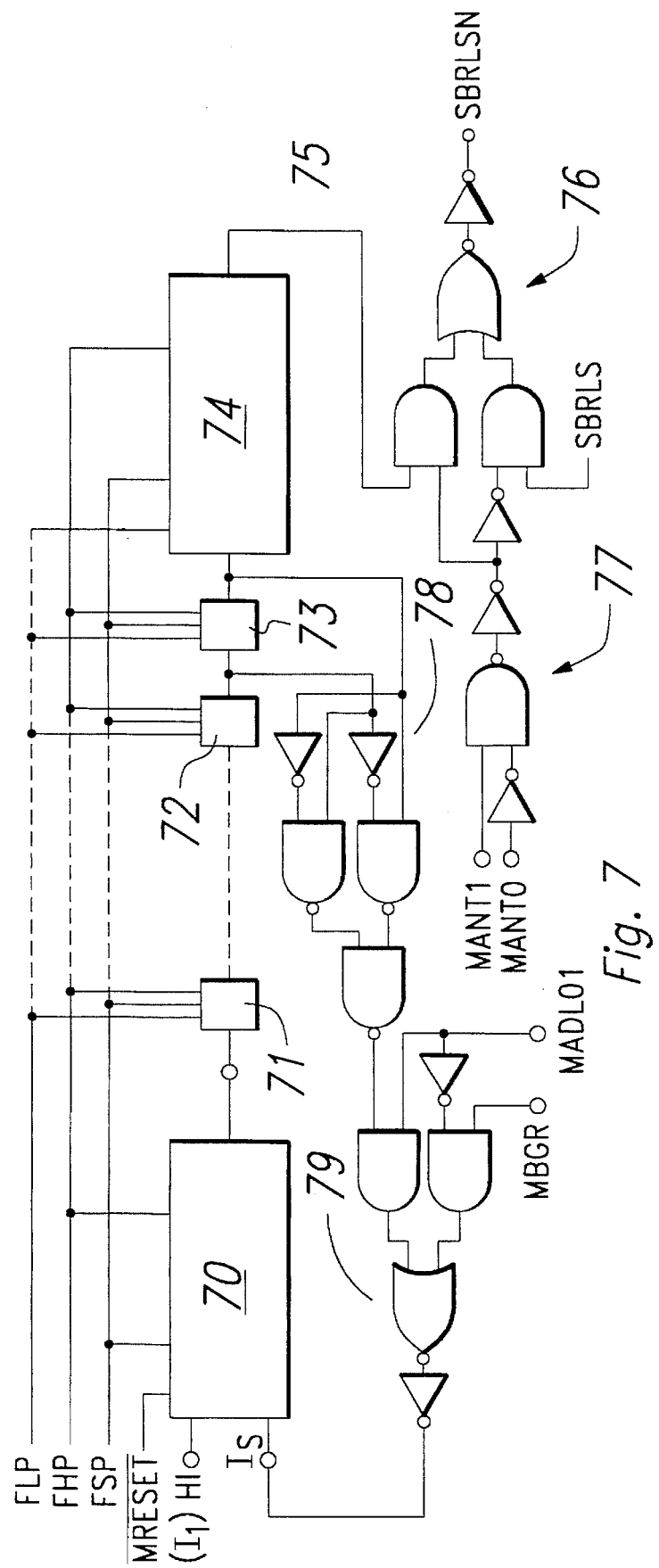

In accordance with design for test practice, the clock signals FLP, FHP and FSP are fed to device shift register latches, for example, shift register latch 71 (FIG. 7). Further shift register latches 72, 73, 74 are shown connected in a scan chain as hereinbefore described. Scan outputs from shift register latches 72 and 73 are fed back to the scan input of a first shift register latch 70 via Exclusive-OR gating 78 and selector gates 79. In this way, the shift register latches behave as a linear feedback shift register and self excitation of the device is possible provided appropriate signal levels are applied to selector gates (input MADL01) to disable normal input MBGR and enable the feedback. Shift register latch 70 receives a high input $I_1$ and the reset signal as master clock so that the linear feedback shift register is always loaded with a non zero initial value as previously described.

The scan output 75 of the last shift register latch 74 is fed to an output SBRLSN via a selector gate 76. The selector is controlled by the output of gates of logic 77. It will be noted that when MANT1 is high and MANT0 is low (the test condition) then the normal pin output SBRLS is disabled and the scan output appears at SBRLSN.

FIG. 8 represents external components to which the device needs to be connected to exercise itself. Typically, these components may be mounted on an environmental test chamber fixture, for example, a printed circuit board to be placed in the chamber. The components are principally resistors, for example, resistor 81 connected to pull up the inputs of the device to one of two power supplies (PS1, PS2). Alternatively, some pins are directly connected to ground. A capacitor is connected between pin PLLCAP and ground to provide a feedback capacitor for the on board phase locked loop clock generator 53. Further, a clock signal generator 83 provides an input to the clock input pin MBCLK1.

It will be appreciated that this small number of external components is all that is required to provide an exercised device to which an accelerated life test may be given. This will be contrasted with the prior art, where test pattern generators would be required either on the fixture or connected from outside the environmental chamber.

To effect a burn-in test, the fixture is placed in a test chamber, the test conditions established and the device energised.

The invention is also applicable to integrated logic circuits including an integrated device interconnected with other circuit components.

I claim:

1. A method of testing an IC logic chip having storage elements configurable as part of a scan path, without applying an external test data signal, comprising the steps of:

(a) providing a feedback from elements in the scan path to a previous element in the scan path to internally produce a pseudo random binary testing sequence for an internal test data signal input of the scan path;

(b) applying a scan clock to reconfigure the elements into the scan path; and (c) monitoring an output of the scan path to assess the response of the IC logic chip to the internal test data signal.

2. An IC logic chip testable without applying an external test data signal, comprising:

storage elements configurable as a scan path having an input for an internal test data signal and an output, a feedback from elements in the path to a previous element in the scan path to produce a pseudo random binary testing sequence for the input of the scan path, a scan clock for reconfiguring the elements into the scan path, and a monitor circuit responsive to the output of the scan path for assessing the response of the IC logic chip to the internal test data signal.

3. An IC logic chip as claimed in claim 2 wherein the feedback arrangement provides a linear feedback shift register.

4. An IC logic chip as claimed in claim 3 wherein the feedback path includes Exclusive-OR gating.

5. An IC logic chip as claimed in claim 3 wherein at least one of the elements is arranged for a non-zero initial value.

6. An IC logic chip as claimed in claim 2 wherein at least part of the feedback path is integrated within a device.

* * * * *